United States Patent [19]

Tanabe et al.

[11] Patent Number: 5,380,516
[45] Date of Patent: Jan. 10, 1995

[54] PROCESS FOR SYNTHESIZING DIAMOND IN A VAPOR PHASE

[75] Inventors: Keiichiro Tanabe; Takahiro Imai; Naoji Fujimori, all of Itami, Japan

[73] Assignee: Sumitomo Electric Industries, Ltd., Japan

[21] Appl. No.: 931,494

[22] PCT Filed: May 25, 1989

[86] PCT No.: PCT/JP89/00531

§ 371 Date: Jan. 24, 1990

§ 102(e) Date: Jan. 24, 1990

[87] PCT Pub. No.: WO89/11556

PCT Pub. Date: Nov. 30, 1989

Related U.S. Application Data

[63] Continuation of Ser. No. 459,836, Jan. 24, 1990, abandoned.

[30] Foreign Application Priority Data

May 28, 1988 [JP] Japan .................. 63-130905
Jun. 10, 1988 [JP] Japan .................. 63-144185

[51] Int. Cl.⁶ .................................. C01B 31/65
[52] U.S. Cl. ................................ 423/446; 427/249; 427/255.1
[58] Field of Search ............ 423/446; 156/DIG. 68; 427/249, 255.1

[56] References Cited

U.S. PATENT DOCUMENTS

| | | | |
|---|---|---|---|
| 4,767,608 | 8/1988 | Matsumoto et al. | 156/DIG. 68 |
| 4,938,940 | 7/1990 | Hirose et al. | 423/446 |
| 4,985,227 | 1/1991 | Ito et al. | 423/446 |
| 4,992,298 | 2/1991 | Deutchmann et al. | 423/446 |

FOREIGN PATENT DOCUMENTS

| | | | |
|---|---|---|---|
| 158899 | 7/1986 | Japan | 423/446 |
| 123897 | 5/1988 | Japan . | |
| 185894 | 8/1988 | Japan . | |
| 64266 | 1/1989 | Japan | 423/446 |
| 301586 | 12/1989 | Japan . | |
| 313393 | 12/1989 | Japan . | |

OTHER PUBLICATIONS

English Translation of JP 61-15889, Jul. 18, 1986.
Chen, "Materials Research Ball.", 24(1) 87-94 (Jan. 1989).
Chang et al., "J. Appl. Phys.", 63(5) 1744-1748 (Mar., 1988).
"Patent Abst. of Japan", 11(63) (C-406) [2510] Feb. 26, 1987 Abstracting JP-A-61222915.
"Patent Abst. of Japan", 12(110) (C-486) [2957] Apr. 8, 1988 abstracting JP-A-62 235295.
"Patent Abst. of Japan", 10(362) (C-389) [2419] Dec. 4, 1986 abstracting JP-A-61 158899.
Meyer et al., "Proc. SPIE", 1146 21-25 (1989).
Meyer et al., "Proc. 1st Int. Symp. on Diamond and Diamond-like Films", 89(12) 494-499 (1989).

*Primary Examiner*—Michael Lewis
*Assistant Examiner*—Stephen G. Kalinchak
*Attorney, Agent, or Firm*—Wenderoth, Lind & Ponack

[57] ABSTRACT

The present invention relates to a method for synthesizing diamond by chemical vapor deposition (CVD) process, and specifically a chemical deposition process which allows production of diamond of high purity and high crystallizability having various uses at low cost and at high speed. In the first method for the present invention, a mixture of oxygen gas and a carbon-containing compound gas and optionally an inert gas is introduced into a reaction vessel and a plasma is generated by use of an electromagnetic field, thereby producing diamond on a substrate placed in the vessel. In the second method of the present invention, a mixture containing at least one of fluorine gas, chlorine gas, a nitrogen oxide gas and sulfur dioxide gas, or a mixture of the gas mixture with oxygen gas and a carbon-containing compound gas, or a mixture thereof with an inert gas is introduced into a reaction vessel, and a plasma is generated by use of an electromagnetic field, thereby producing diamond on a base material placed in the vessel.

1 Claim, 3 Drawing Sheets (a) $H_2 + CH_4$
(NO. 13 IN TABLE 2)

(b) $O_2 - CH_4$
(NO. 2 IN TABLE 1)

PROCESS FOR SYNTHESIZING DIAMOND IN A VAPOR PHASE

This application is a continuation of now abandoned application Ser. No. 07/459,836 filed on Jan. 24, 1990.

TECHNICAL FIELD

The present invention relates to a process for synthesizing diamond by chemical vapor deposition process which allows production of diamond having high purity, high crystallizability and high versatility at low cost and at high speed.

BACKGROUND ART

An artificial diamond was heretofore been synthesized under high-temperature, high-pressure thermodynamically equilibrium conditions. But recently a process for synthesizing diamond in a vapor phase has been developed.

In the vapor deposition process, hydrocarbon gas diluted with an over ten times larger volume of hydrogen is excited by a plasma or a hot filament to form a layer of diamond on a substrate in a reaction chamber.

As another prior art method, it is known to introduce a preheated material gas onto a heated substrate to pyrolytically decompose hydrocarbon to separate diamond (Japanese Patent No. 1272728).

Any prior art method for synthesizing diamond in a vapor phase requires basically a large amount of hydrogen, though it considers various methods for introducing neat to start a chemical reaction. Thus the cost for the material gas tends to be high. Moreover, hydrogen tends to be trapped in the diamond, thus lowering its purity and crystallizability. Also this will set limitations on the synthesis conditions of diamond, the speed of synthesis, the area of synthesis and the material of the substrate.

It is an object of the present invention to obviate these problems.

DISCLOSURE OF THE INVENTION

The present inventors have given consideration to various gas conditions to find out that a stable plasma can be produced and diamond having a good crystallizability can be produced at a high speed over a large area under the following conditions where no hydrogen is used except for the hydrogen which may be contained in the compound gas. The conditions of gas can be classified into two groups.

Namely, in the first method of the present invention, a mixture of oxygen gas and a carbon-containing compound gas or a mixture further containing an inert gas is introduced into a reaction vessel and a plasma is generated by an electromagnetic field, thereby producing diamond on a substrate placed in the vessel.

In the second method of the present invention, a gas mixture of one or two or more of fluorine gas, chlorine gas, a nitrogen oxide gas and a sulfur dioxide gas, or a mixture of the gas mixture with oxygen gas and a carbon-containing compound gas, or a mixture further containing an inert gas is introduced into a reaction vessel, and a plasma is generated by use of an electromagnetic field, thereby producing diamond on a substrate placed in the vessel.

With these methods, diamond develops uniformly and several times faster than with any prior art chemical vapor deposition (CVD) process, in which an expensive hydrogen gas is used in great amounts, and the diamond thus obtained contains no hydrogen over a large area (several tens of square millimeters) and has a high purity and a high crystallizability.

Either a direct current or alternating current electromagnetic field may be used to produce a plasma. In the latter case, it should be a high-frequency wave or a microwave having a frequency of over 1 $KH_Z$ for better controllability.

In order to produce a film of diamond of high purity and high crystallizability while preventing the deposition of non-diamond carbon, the gases should be mixed in the first method so that the ratio between the oxygen atoms and the carbon atoms in the material gas (oxygen/carbon) is 5–0.05 and preferably 2–0.1 and if the carbon compound contains hydrogen, the ratio among the oxygen, carbon and hydrogen atoms (oxygen/(carbon+hydrogen)) is 4–0.01 and preferably 1–0.05.

If an inert gas is used in the first method, the ratio of atoms among the inert gas, oxygen and carbon (inert gas/(oxygen+carbon)) should be 100–0 and preferably 20–0.02.

In the second method, the gases used should be mixed so that the ratio of atoms among fluorine (F), chlorine (Cl), oxygen (O) and carbon ((F+Cl+O)/C) in the material gas is 5–0.05 and preferably 1.8–0.09. If the carbon compound contains hydrogen, the ratio of atoms among fluorine (F), chlorine (Cl), oxygen (O), carbon (C) and hydrogen (H) (F+Cl+O)/(C+H) should be 4–0.01 and preferably 0.9–0.04.

If an inert gas is used in the second method, the ratio of atoms among the inert gas (X), fluorine (F), chlorine (Cl), oxygen (O), nitrogen (N), sulfur (S), and carbon (C) (X/(F+Cl+O+C) should be 100–0 and preferably 20–0.01.

The use of inert gas is highly desirable in either of the first and second methods because it not only makes it possible to produce a plasma in a wide pressure range and accelerate and developing speed, but also facilitates coating over a wide area.

The inert gas used in the present invention may be helium (He), neon (Ne), argen (Ar), kripton (Kr) or xenon (Xe) or a combination thereof. In view of the mass-productivity and production cost of diamond, argon gas is the most desirable because it is inexpensive.

The carbon-containing compound gas may be methane, ethane, acetylene, propane, natural gas, carbon monoxide or carbon dioxide in the form of a gas or an organic compound containing a small amount of oxygen,nitrogen or sulfur in its alcohol molecules or the like.

The aforementioned and other preferred modes of the present invention are briefly described below.

(1) If an alternating current electromagnetic field is used to generate a plasma, it should be a high-frequency wave or a microwave having a frequency of 1 $KH_Z$ or more and preferably be a microwave having a frequency of 300 $MH_Z$ or more.

(2) The carbon-containing compound gas to be mixed with other gases should be one or two or more selected from an aliphatic hydrocarbon, an aromatic hydrocarbon, alcohol and ketone.

(3) The electric power for the generation of a plasma should be 1 $W/cm^3$ or more and the pressure in the reaction chamber should be 5–760 Torr.

(4) The flow rate of the gas mixture at the reaction portion for the production of diamond should be 0.1 cm/sec or higher.

(5) In the first method the gases should be mixed so that the ratio of atoms in the material gases will be:

5–0.05 and preferably 2–0.1 in the oxygen/carbon ratio;

4–0.01 and preferably 1–0.05 in the oxygen/(carbon+hydrogen) ratio, if the carbon-containing compound gas contains hydrogen.

In the second method, the gases should be mixed so that the ratio of atoms in the material gases will be 5–0.05 and preferably 1.8–0.09 in the (F+Cl+O)/C ratio; and If the carbon-containing compound gas contains hydrogen, it will be 4–0.01 and preferably 0.9–0.04 in the (F+Cl+O)/(C+H) ratio.

(6) If an inert gas is used, the ratio of atoms in the first method should be 100–0 and preferably 20–0.02 in the inert gas/(oxygen+carbon) ratio; and the ratio of atoms in the second method should be 100–0 and preferably 20–0.01 in the X (insert gas)/(F+Cl+O+C) ratio.

According to the present invention, such manufacturing conditions as the temperature of the substrate (300°–1200° C.), the pressure in the reaction tube, the ratio of mixture of gases, and the flow rate of gas can be readily controlled. Also, the use of an oxygen plasma makes it possible to form a diamond coating even on a substrate having a three-dimensional structure, which was heretofore been difficult. Further, since no hydrogen is used, a diamond coating can be formed even on a substrate which is liable to get brittle under the influence of hydrogen.

By suitably setting the manufacturing conditions, diamond of a large grain size, over several hundred microns in diameter, can be developed at a high speed. A microwave is the most preferable for the formation of plasma in the production of diamond in a vapor phase. Electrodes should preferably not be provided in the reaction vessel in order to stabilize the plasma. The temperature of the substrate may be controlled by cooling it or by use of a heating means. Such means may be made of an insulating material in order to prevent the plasma from being disturbed if it is placed in the reaction vessel.

The substrate used may be a ceramic such as silicon, $Si_3N_4$, SiC, BN, $B_4C$ and AlN, or a metal having a high melting point such as molybdenum, tungsten, tantalum and niobium. If the temperature of the substrate is low, copper or aluminum or their alloy or cemented carbide may be used. If the reaction takes place in an atmosphere containing oxygen, it is necessary to control the partial pressure with hydrogen which is produced by decomposition. Further the emission spectral analysis revealed that the plasma generated under the conditions according to the present invention differs from the plasma generated by the prior art method in which hydrogen gas is used as a main material gas, in that the former is relatively low in the strength of the hydrogen continuous band and high in the strength of hydrogen atoms such as H (X). This suggests that the decomposition of the material gas takes place more efficiently in the method according to the present invention than in the prior art method (FIG. 8).

In the prior art method, the deposition of diamond occurs under a low degree of saturation of the carbon-containing compound gas, i.e. while its concentration with respect to the hydrogen gas is as low as several per cent by volume (0.8–2.0 per cent by volume), whereas in the method according to the present invention, it occurs while the degree of saturation is several hundred times higher than with the prior art method. It is presumed that this makes it possible to deposit film of diamond which has less defects and is of high quality.

According to the present invention, because oxygen is used (in the first method) for the synthesis of diamond by the plasma CVD process, instead of using a large amount of hydrogen as with the prior art method, and in the second method, a mixture containing one or more of fluorine gas, chlorine gas, nitrogen oxide gas, and sulfur dioxide gas, or the mixture further containing oxygen gas is used, the following effects can be obtained.

(1) Since oxygen used in the first method is cheaper than hydrogen, the production cost can be reduced.

(2) A diamond coating can be formed even on a substrate which is liable to get brittle, such as titanium.

(3) A film of diamond of high purity and high crystallizability containing no hydrogen is obtainable.

(4) By suitably setting the manufacturing conditions, diamond can be selectively developed in the form of either grains or a film at a speed of more than 100 microns/hour.

(5) A diamond coating can be formed not only on a substrate having a complex shape but also over a large area.

(6) In the method where an inert gas is used, a plasma can be generated within a wide pressure range. This serves to further increase the developing speed of diamond as well as the area of development.

The above-described effects suggest that the method according to the present invention can be used for the production of a diamond heat sink and diamond abrasive grains which have heretofore been produced exclusively by the high-pressure process. The method of the present invention can also be used for the production of diamond in the form of a film no more than several microns thick and a substrate several tens of microns thick and which can be used in a field where the film is required to have a high heat conductivity, a low inductivity, a high light transmittance, a high specific elastic modulus, a high strength and a high resistance to wear.

This method can be carried out with a conventional device without the necessity of changing the abovementioned manufacturing steps or adding extra steps thereto. This will permit a stable operation and ensure a low facility cost.

BEST MODE FOR EMBODYING THE INVENTION

FIGS. 1 to 4 show schematic views of devices for synthesizing diamond which are applicable to the present invention.

Figure 1:
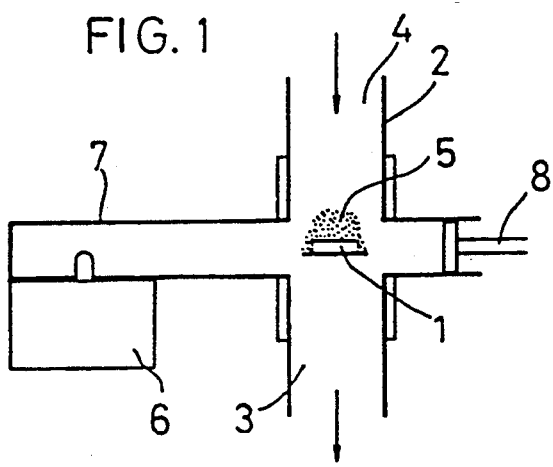
FIGS. 1 to 4 are schematic views of plasma CVD devices applicable to the method according to the present invention.
Figure 2:
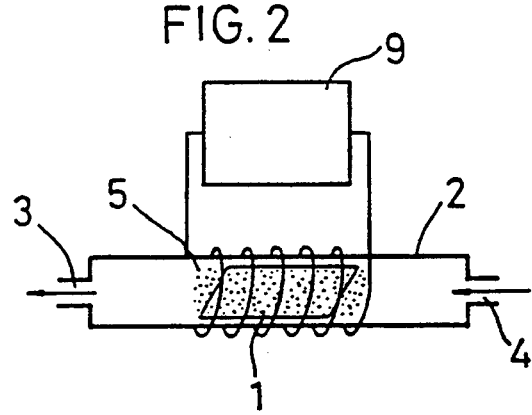
Figure 3:
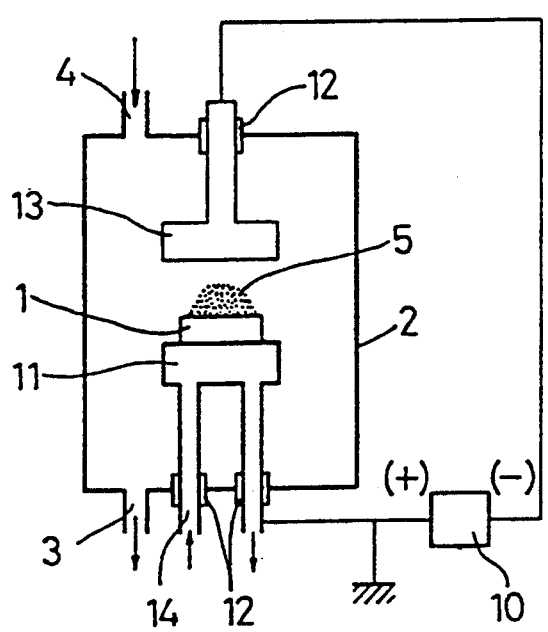
Figure 4:
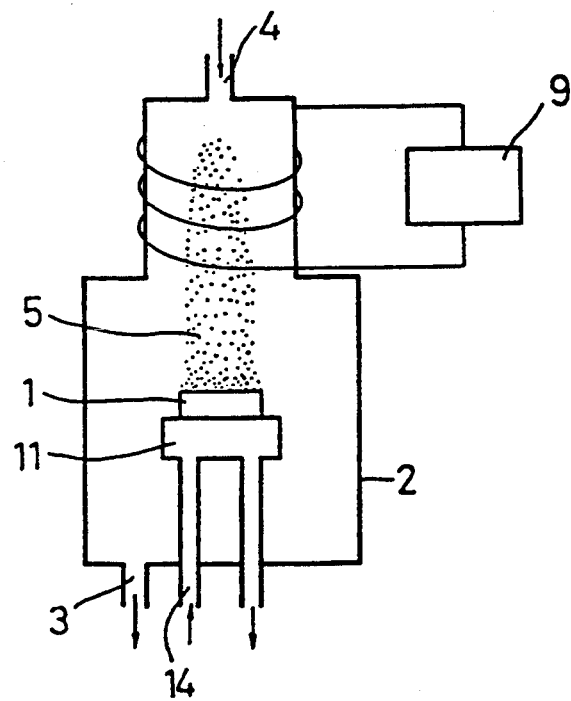

FIG. 1 shows a microwave plasma CVD device (hereinafter referred to as $\mu$-PCVD). FIG. 2 shows a high-frequency plasma CVD device (hereinafter referred to as RF-PCVD). FIG. 3 shows a direct current plasma CVD device (hereinafter referred to as DC-PCVD). FIG. 4 shows a high-frequency high-temperature plasma CVD device (hereinafter referred to as RF-HPVCD). Any of these devices can be used in the present invention. In the drawings, numeral 1 shows a substrate, 2 is a reaction silica tube, 3 is a vacuum discharge port, 4 is an inlet for material gas, 5 is a plasma generated, 6 is a magnetron, 7 is a waveguide, 8 is a plunger for adjusting the position of plasma, 9 is an RF power source, 10 is a DC power source, 11 is a table for supporting the substrate, 12 is an insulating seal, and 13 is a cathode. The silica tube shown in FIG. 4 can be cooled.

Next, description will be made of the examples according to the present invention and comparative examples, in which the above-described four devices were used.

EXPERIMENT 1

Comparison between the first method and a prior art

The devices used and other manufacturing conditions are shown in Tables 1 and 2. The substrates used both in the Examples and the comparative examples were single-crystal silica wafers of 2 inch (50.8 mm in diameter) finished by use of #5000 diamond powder. A material gas was introduced with the substrate held in the reaction silica tube 2 and a plasma was generated by a plasma generator under the pressure of 1 Torr. The pressure in the tube was increased quickly to the pressure levels shown in Table 1 and held at those levels to develop and synthesize diamond on the substrate for the periods shown in Table 1. The surface temperature of the substrate was measured by use of an optical pyrometer by momentarily interrupting the generation of plasma.

Tables 1 and 2 show the results of surface observation of each of the diamond specimens produced under the respective conditions by use of a scanning type electron microscope, measurement of film thickness, X-ray analysis and evaluation of crystallizability by the Raman scattering spectrum process.

Figure 5:
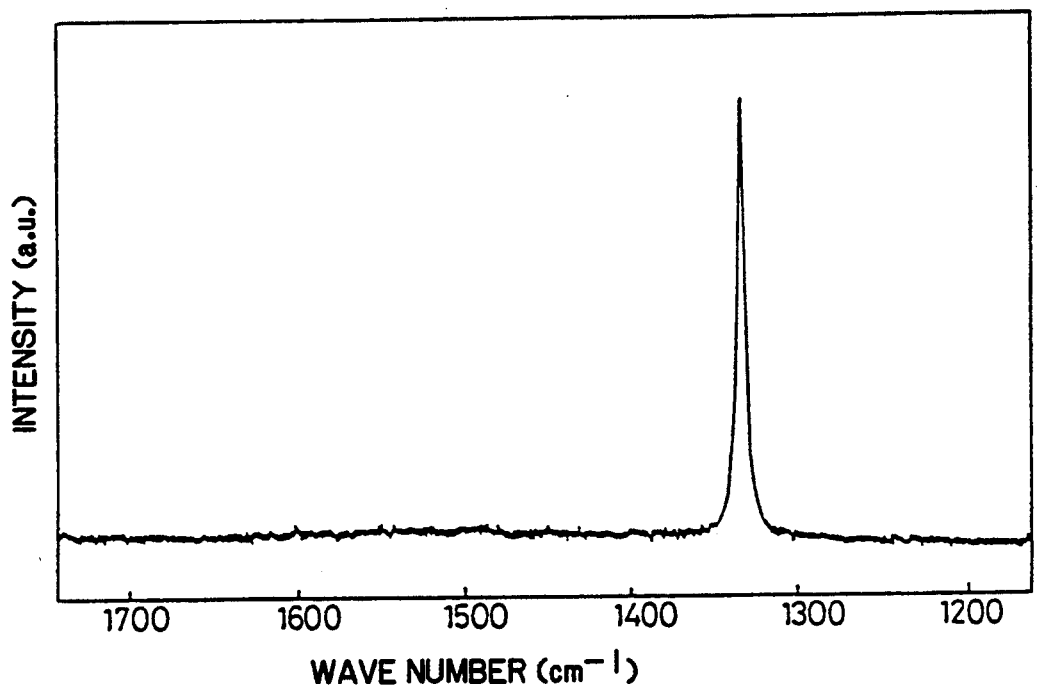
FIGS. 5 to 7 are graphs showing a Raman spectrum, a penetrating spectrum and cathode luminescence spectrums for each specimen shown in Table 1.
Figure 6:
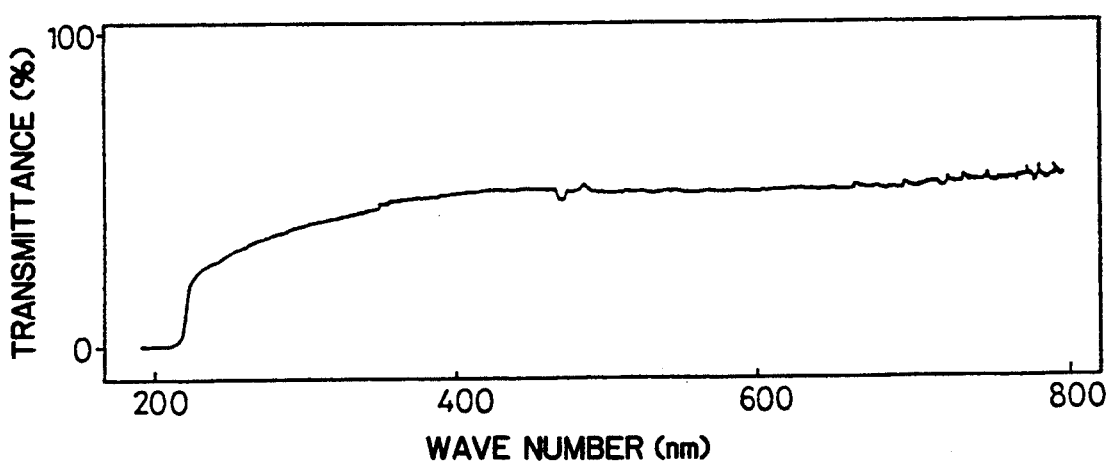
Figure 7:
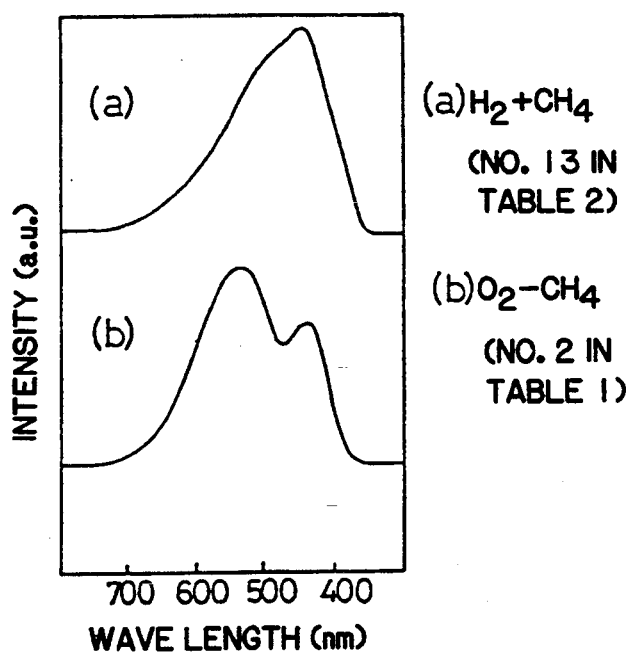
Figure 8:
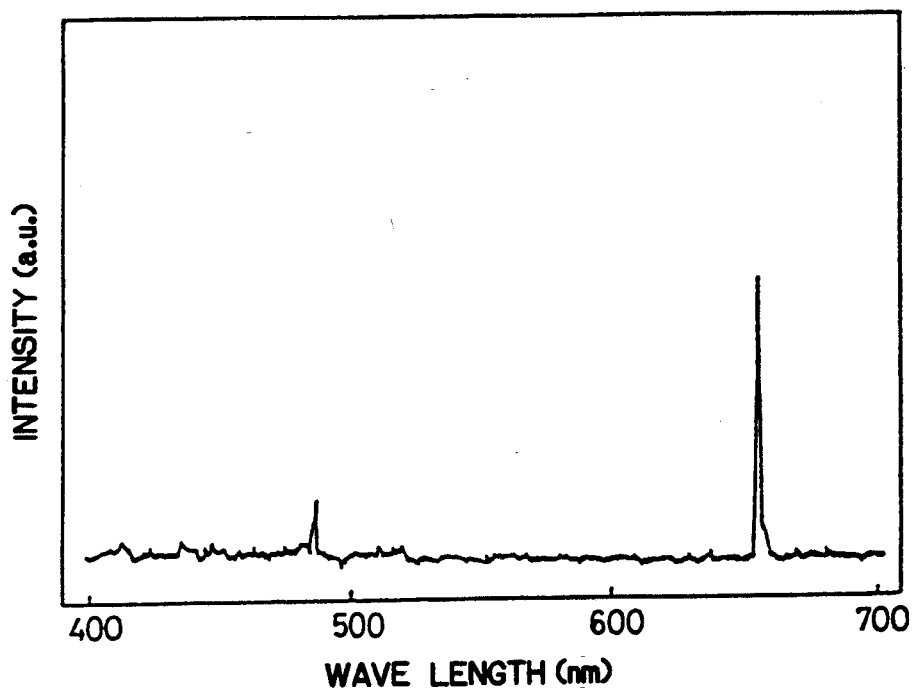
FIG. 8 is a graph showing an emission spectrum of the plasma.

FIGS. 5 to 7 show a Raman spectrum, a penetrating spectrum in the ultraviolet and visible ranges, and cathode luminescence spectrums generated by irradiation of electron beams for the specimen No. 2 in Table 1, respectively. FIG. 5 shows that the diamond film thus produced has an excellent crystallizability.

FIG. 6 shows that it has an absorption end in the region of 225 nm in wave number and has a high transmittance from the ultraviolet region to the infrared region. Thus it is believed that such a material can be advantageously used for window material. In FIG. 7, the curve (a) shows a cathode luminescence spectrum of a prior art specimen (sample No. 13 in Table 2) made by use of hydrogen and curve (b) shows a spectrum of a specimen (sample No. 2 in Table 1) made by use of oxygen. Ti/Mo/Au electrodes were metallized to measure the electrical resistance. The resistance measured was over $10^{12}$ ohms, which reveals that the resistance can be kept stably at a very high level even after the metallization of diamond.

EXPERIMENT 2

Comparison between the second method and a prior art method

Tables 3 and 4 show the devices used and the manufacturing conditions in this experiment. In this experiment, diamond was developed and synthesized on the same single-crystal silica wafer as that used in the experiment 1 under the same conditions as the experiment 1. The specimens thus produced were evaluated in the same manner as with the experiment 1.

In the tables, "Dia" indicates diamond, "gr" does graphite, and "a-c" does amorphous carbon. In Table 3, F indicates fluorine, Cl does chlorine, O does oxygen, C does carbon and X does at least one inert gas.

| | | Present Invention Manufacturing Conditions | | | | | | | | | |
|---|---|---|---|---|---|---|---|---|---|---|---|
| Sample No. | Mfg. method | Gas used flow rate (SCCM) | | | Pressure (Torr) | Time (h) | O/C | O/(C + H) | Inert gas/ (O + C) | Elec. Power (W) | Substrate temp. (°C.) |
| 1 | μ-PCVD | $O_2$ 100 | | $CH_4$ 100 | 80 | 10 | 2 | 0.4 | — | 500 | 850 |
| 2 | μ-PCVD | $O_2$ 240 | | $CH_4$ 360 | 100 | 5 | 1.3 | 0.27 | — | 600 | 800 |
| 3 | μ-PCVD | $O_2$ 400 | | $C_2H_2$ 600 | 100 | 2 | 0.67 | 0.33 | — | 800 | 900 |
| 4 | μ-PCVD | $O_2$ 50 | | CO 400 | 150 | 1 | 1.25 | — | — | 400 | 880 |
| 5 | μ-PCVD | $O_2$ 100 | Ar 2000 | $CO_2$ 800 | 400 | 5 | 2.25 | — | 0.77 | 1000 | 920 |
| 6 | μ-PCVD | $O_2$ 200 | He 50 | $C_3H_8$ 500 | 600 | 10 | 0.27 | 0.073 | 0.026 | 1500 | 890 |
| 7 | RF-PCVD | $O_2$ 300 | | $C_2H_2$ 400 | 5 | 10 | 0.75 | 0.375 | — | 1000 | 800 |
| 8 | DC-PCVD | $O_2$ 100 | Ar 100 | $CH_4$ 150 | 200 | 10 | 1.3 | 0.27 | 0.29 | 1000 | 950 |
| 9 | RF-HPCVD | $O_2$ 2000 | Ar 20000 | $C_2H_4$ 2000 | 200 | 1 | 1.0 | 0.33 | 2.5 | 4500 | 950 |
| 10 | μ-PCVD | $O_2$ 50 | | $CH_4$ 1000 | 100 | 1 | 0.1 | 0.02 | — | 1500 | 900 |
| 11 | μ-PCVD | $O_2$ 1000 | Ar 100 | $CH_4$ 100 | 400 | 2 | 20 | 4 | 0.048 | 800 | 850 |
| 12 | RF-PCVD | $O_2$ 1 | Ne 800 | $C_2H_2$ 1 | 80 | 10 | 1 | 0.5 | 50 | 1000 | 850 |
| 13 | μ-PCVD | $O_2$ 240 | | $CH_4$ 360 | 80 | 1 | 1.3 | 0.27 | — | 200 | 400 |
| 14 | μ-PCVD | $O_2$ 100 | Ar 100 | $CH_4$ 150 | 80 | 1 | 1.3 | 0.27 | 0.29 | 100 | 350 |

-continued

Present Invention
Results

| Sample No. | Deposition speed (μm/h) | Film thickness (μm) | Separated area (mm$^2$) | Line diffraction | Raman spectroscope | Remarks |
|---|---|---|---|---|---|---|
| 1 | 10 | 100 | 1950 | Dia | Dia | |
| 2 | 40 | 200 | 1800 | Dia | Dia | |
| 3 | 100 | 200 | 800 | Dia | Dia | |
| 4 | 300 | 300 | 600 | Dia | Dia | |
| 5 | 200 | 1000 | 400 | Dia | Dia | |
| 6 | 500 | 5000 | 500 | Dia | Dia | |
| 7 | 5 | 50 | 1600 | Dia | Dia | |
| 8 | 200 | 2000 | 80 | Dia | Dia | |
| 9 | 700 | 700 | 100 | Dia | Dia | |
| 10 | 10 | 10 | 1800 | Dia +gr | Dia +gr +a-c | Reaction tube dirty poor crystalizability |
| 11 | 0.01 | 0.02 | 300 | Dia | Dia | Slow growth |
| 12 | 0.1 | 1 | 1900 | Dia +gr | +Dia +gr +a-c | Poor crystalizability |
| 13 | 2 | 2 | 800 | Dia | Dia | Slow growth |
| 14 | 1 | 1 | 800 | Dia | Dia | Slow growth |

TABLE 2

Comparative Examples
Manufacturing Conditions

| Sample No. | Mfg. method | Gas used flow rate (SCCM) | | | | Pressure (Torr) | Time (h) | O/C | O/(C + H) | Inert gas/ (O + C) | Elec. Power (W) | Substrate temp. (°C.) |
|---|---|---|---|---|---|---|---|---|---|---|---|---|
| 13 | μ-PCVD | H$_2$ 200 | | | CH$_4$ 5 | 40 | 1 | — | — | — | 400 | 900 |
| 14 | μ-PCVD | H$_2$ 50 | | C$_2$H$_2$ 0.25 | O$_2$ 0.1 | 50 | 10 | — | — | — | 500 | 850 |
| 15 | μ-PCVD | H$_2$ 100 | Ar 10 | C$_2$H$_5$OH 1000 | H$_2$O 4 | 80 | 4 | — | — | — | 800 | 880 |
| 16 | RF-PCVD | H$_2$ 100 | He 100 | | CH$_4$ 2 | 1 | 10 | — | — | — | 1000 | 800 |
| 17 | DG-PCVD | H$_2$ 100 | | | C$_2$H$_5$OH 100 | 200 | 2 | — | — | — | 1200 | 920 |
| 18 | RF-HPCVD | H$_2$ 8000 | Ar 10000 | | CH$_4$ 200 | 200 | 0.5 | — | — | — | 5000 | 900 |

Comparative Examples
Results

| Sample No. | Deposition speed (μm/h) | Film thickness (μm) | Separated area (mm$^2$) | Line diffraction | Raman spectroscope | Remarks |
|---|---|---|---|---|---|---|
| 13 | 1 | 1 | 800 | Dia | Dia +a-c | |
| 14 | 0.5 | 5 | 400 | Dia | Dia | |
| 15 | 1.5 | 6 | 300 | gr | gr | |
| 16 | 0.1 | 1 | 600 | Dia +gr | Dia +gr +a-c | |
| 17 | 20 | 40 | 15 | Dia +gr | Dia +gr +a-c | |
| 18 | 80 | 40 | 10 | Dia | Dia | Plasma unstable |

TABLE 3

Present Invention
Manufacturing Conditions

| Sample No. | Mfg. method | Gas used flow rate (SCCM) | | | | Pressure (Torr) | Time (h) | (F + Cl + O)/C | (F + Cl + O)/ (C + H) | X/(F + Cl + O + C) | Elec. power (W) | Substrate temp (°C.) |
|---|---|---|---|---|---|---|---|---|---|---|---|---|
| 1 | μ-PCVD | F$_2$ 50 | | | CH$_4$ 100 | 90 | 10 | 1 | 0.2 | — | 480 | 870 |
| 2 | μ-PCVD | F$_2$ 150 | | | CH$_4$ 360 | 80 | 5 | 0.83 | 0.17 | — | 550 | 820 |
| 3 | μ-PCVD | F$_2$ 320 | | | C$_2$H$_2$ 600 | 180 | 2 | 0.53 | 0.27 | — | 650 | 880 |
| 4 | μ-PCVD | F$_2$ 20 | NO 10 | | CO 400 | 150 | 10 | 1.13 | — | — | 500 | 900 |
| 5 | μ-PCVD | Cl$_2$ 5 | Ar 100 | | CO$_2$ 800 | 400 | 5 | 2.01 | — | 0.042 | 1100 | 925 |
| 6 | μ-PCVD | F$_2$ | Cl$_2$ | He | C$_3$H$_8$ | 600 | 10 | 0.27 | 0.073 | 0.26 | 1600 | 900 |

TABLE 3-continued

| Sample No. | Mfg. method | Gas used flow rate (SCCM) | | | | Pressure (Torr) | Time (h) | (F + Cl + O)/C | (F + Cl + O)/(C + H) | X/(F + Cl + O + C) | Elec. power (W) | Substrate temp (°C.) |
|---|---|---|---|---|---|---|---|---|---|---|---|---|
| 7 | RF-PCVD | F₂ 300 | 100 | 100 | 500 C₂H₂ 400 | 500 | 5 | 1 | 0.75 | 0.375 | — | 1200 | 820 |
| 8 | DC-PCVD | F₂ 100 | Ne 100 | | CH₄ 150 | 200 | 10 | 1.3 | 0.27 | 0.29 | 1000 | 950 |
| 9 | RF-HPCVD | Cl₂ 2000 | Ar 2000 | | C₂H₂ 2000 | 200 | 1 | 0.5 | 0.5 | 2.5 | 5500 | 950 |
| 10 | μ-PCVD | F₂ 50 | | | CH₄ 1000 | 120 | 1 | 0.1 | 0.02 | — | 2000 | 920 |
| 11 | μ-PCVD | F₂ 500 | Cl₂ 500 | Ar 100 | CH₄ 100 | 400 | 2 | 20 | 4 | 0.048 | 900 | 900 |
| 12 | RF-PCVD | Cl₂ 1 | Ar 600 | He 200 | C₂H₂ 1 | 80 | 10 | 1 | 0.5 | 50 | 1000 | 800 |

Present Invention
Results

| Sample No. | Deposition speed (μm/h) | Film thickness (μm) | Separated area (mm²) | Line diffraction | Raman spectroscope | Remarks |
|---|---|---|---|---|---|---|
| 1 | 4 | 40 | 1940 | Dia | Dia | |
| 2 | 20 | 100 | 1600 | Dia | Dia | |
| 3 | 80 | 160 | 1000 | Dia | Dia | |
| 4 | 40 | 400 | 550 | Dia | Dia | |
| 5 | 180 | 900 | 500 | Dia | Dia | |
| 6 | 520 | 5200 | 400 | Dia | Dia | |
| 7 | 3 | 3 | 1700 | Dia | Dia | |
| 8 | 180 | 1800 | 85 | Dia | Dia | |
| 9 | 650 | 650 | 90 | Dia | Dia | |
| 10 | 8 | 8 | 1950 | Dia +gr | dia +gr +a-c | Reaction tube dirty Poor crystallizability |
| 11 | 0.007 | 0.014 | 300 | Dia | Dia | Poor growth |
| 12 | 0.08 | 0.8 | 1600 | Dia +gr | +Dia +gr +a-c | Poor crystallizability |

Comparative Examples
Manufacturing Conditions

| Sample No. | Mfg. method | Gas used flow rate (SCCM) | | | | Pressure (Torr) | Time (h) | (F + Cl + O)/C | (F + Cl + O)/(C + H) | X/(F + Cl + O + C) | Elec. power (W) | Substrate temp (°C.) |
|---|---|---|---|---|---|---|---|---|---|---|---|---|
| 13 | μ-PCVD | H₂ 200 | | | CH₄ 5 | 40 | 1 | — | — | — | 400 | 900 |
| 14 | μ-PCVD | H₂ 50 | | C₂H₂ 0.25 | O₂ 0.1 | 50 | 10 | — | — | — | 500 | 850 |
| 15 | μ-PCVD | H₂ 100 | Ar 10 | C₂H₅OH 1000 | H₂O 4 | 80 | 4 | — | — | — | 800 | 880 |
| 16 | RF-PCVD | H₂ 100 | He 100 | | CH₄ 2 | 1 | 10 | — | — | — | 1000 | 800 |
| 17 | DC-PCVD | H₂ 100 | | | C₂H₅OH 100 | 200 | 2 | — | — | — | 1200 | 920 |
| 18 | RF-HPCVD | H₂ 8000 | Ar 10000 | | CH₄ 200 | 200 | 0.5 | — | — | — | 5000 | 900 |

Comparative Examples
Results

| Sample No. | Deposition speed (μm/h) | Film thickness (μm) | Separated area (mm²) | Line diffraction | Raman spectroscope | Remarks |
|---|---|---|---|---|---|---|
| 13 | 1 | 1 | 800 | Dia | Dia +a-c | |
| 14 | 0.5 | 5 | 400 | Dia | Dia | |
| 15 | 1.5 | 6 | 300 | gr | gr | |
| 16 | 0.1 | 1 | 600 | Dia +gr | Dia +gr +a-c | |
| 17 | 20 | 40 | 15 | Dia +gr | Dia +gr +a-c | |
| 18 | 80 | 40 | 10 | Dia | Dia | Plasma unstable |

What is claimed is:

1. A method for synthesizing diamond by vapor phase deposition, consisting essentially of the steps of introducing a gas mixture of at least one of fluorine gas and chlorine gas and a gaseous compound containing carbon into a reaction vessel, said gas mixture not containing hydrogen gas, keeping the pressure in said reaction vessel at 5–760 Torr, and generating a plasma in said vessel by means of a direct current or alternating current electromagnetic field, thereby producing diamond on a substrate held in said vessel.

* * * * *